(12) United States Patent
Luo et al.

(10) Patent No.: US 10,319,595 B2
(45) Date of Patent: Jun. 11, 2019

(54) REVERSE CONDUCTING IGBT DEVICE AND MANUFACTURING METHOD THEREFOR

(71) Applicant: ZHUZHOU CRRC TIMES ELECTRIC CO., LTD., Zhuzhou, Hunan (CN)

(72) Inventors: Haihui Luo, Hunan (CN); Haibo Xiao, Hunan (CN); Guoyou Liu, Hunan (CN); Jianwei Huang, Hunan (CN)

(73) Assignee: ZHUZHOU CRRC TIMES ELECTRIC CO., LTD., Zhuzhou, Hunan (CN)

( * ) Notice: Subject to any disclaimer, the term of this patent is extended or adjusted under 35 U.S.C. 154(b) by 0 days.

(21) Appl. No.: 15/762,088

(22) PCT Filed: Jun. 27, 2016

(86) PCT No.: PCT/CN2016/087279
§ 371 (c)(1),
(2) Date: Mar. 21, 2018

(87) PCT Pub. No.: WO2017/084341
PCT Pub. Date: May 26, 2017

(65) Prior Publication Data
US 2018/0269062 A1    Sep. 20, 2018

(30) Foreign Application Priority Data
Nov. 19, 2015    (CN) .......................... 2015 1 0813146

(51) Int. Cl.
*H01L 29/78* (2006.01)
*H01L 21/266* (2006.01)
(Continued)

(52) U.S. Cl.
CPC .......... *H01L 21/266* (2013.01); *H01L 29/495* (2013.01); *H01L 29/66333* (2013.01); *H01L 29/739* (2013.01); *H01L 29/7395* (2013.01)

(58) Field of Classification Search
CPC combination set(s) only.
See application file for complete search history.

(56) References Cited

U.S. PATENT DOCUMENTS 9,023,692 B2    5/2015 Yoshida et al.
9,620,631 B2 *  4/2017 Matsudai ............ H01L 29/7397
(Continued)

FOREIGN PATENT DOCUMENTS

CN    1771604 A      5/2006
CN    102396056 A    3/2012
(Continued)

OTHER PUBLICATIONS

International Search Report for PCT/CN2016/087279, dated Oct. 10, 2016, ISA/CN.

*Primary Examiner* — Hsien Ming Lee
(74) *Attorney, Agent, or Firm* — Yue(Robert) Xu; Apex Attorneys at Law, LLP

(57) ABSTRACT

A reverse conducting IGBT device and a method for manufacturing the reverse conducting IGBT device are provided. The method includes: forming, based on a semiconductor structure including an IGBT cell region and a fast recovery diode cell region which are separated from each other, a copper electrode layer on an upper surface of the IGBT cell region; performing ion implantation on the semiconductor structure by using the copper electrode layer as a barrier layer, for controlling minority carrier lifetime of the fast recovery diode cell region; and forming a metal electrode layer on an upper surface of the fast recovery diode cell region, where the metal electrode layer is electrically con- (Continued)

nected to the copper electrode layer on the upper surface of the IGBT cell region.

16 Claims, 3 Drawing Sheets

(51) Int. Cl.
  *H01L 29/739* (2006.01)
  *H01L 29/49* (2006.01)
  *H01L 29/66* (2006.01)

(56) References Cited

U.S. PATENT DOCUMENTS

| | | |
|---|---|---|
| 2006/0086991 A1 | 4/2006 | Barthelmess et al. |
| 2012/0015508 A1 | 1/2012 | Iwasaki et al. |
| 2013/0249063 A1 | 9/2013 | Shibata et al. |
| 2017/0133227 A1* | 5/2017 | Kajiwara .......... H01L 21/26513 |

FOREIGN PATENT DOCUMENTS

| | | |
|---|---|---|
| CN | 102496572 A | 6/2012 |
| CN | 103165524 A | 6/2013 |
| CN | 103311245 A | 9/2013 |
| CN | 103325669 A | 9/2013 |
| CN | 103715083 A | 4/2014 |
| CN | 105244274 A | 1/2016 |
| JP | 2008192737 A | 8/2008 |

* cited by examiner

REVERSE CONDUCTING IGBT DEVICE AND MANUFACTURING METHOD THEREFOR

This application is the national phase of International Application No. PCT/CN2016/087279, titled "REVERSE CONDUCTING IGBT DEVICE AND MANUFACTURING METHOD THEREFOR", filed on Jun. 27, 2016, which claims the priority to Chinese Patent Application No. 201510813146.2, titled "REVERSE CONDUCTING IGBT DEVICE AND MANUFACTURING METHOD THEREFOR", filed on Nov. 19, 2015 with the State Intellectual Property Office of People's Republic of China, which are incorporated herein by reference in their entireties.

FIELD

The present disclosure relates to the technical field of semiconductors, and in particular to a reverse conducting IGBT device and a method for manufacturing the reverse conducting IGBT device.

BACKGROUND

With the development of science and technology, semiconductor devices are widely used in and bring great convenience to people's work and daily life.

A reverse conducting IGBT (Insulated Gate Bipolar Transistor) is a new type of IGBT device, in which an IGBT cell structure and an FRD (Fast Recovery Diode) cell structure are integrated on a same chip. The reverse conducting IGBT device has advantages such as a small size, a high power density, a low cost and a high reliability. FIG. 1 shows a top view of a new type of reverse conducting IGBT device, which includes an independent IGBT portion 101 and an independent FRD portion 102 surrounding the IGBT portion 101. In this structure, IGBT cells are provided separately from FRD cells, thereby effectively eliminating negative resistance effect of the reverse conducting IGBT device.

However, the performance of the reverse conducting IGBT device with this structure needs to be further improved.

SUMMARY

In view of this, a reverse conducting IGBT device and a method for manufacturing the reverse conducting IGBT device are provided according to the present disclosure, for improving the device performance.

In order to achieve the above object, the following technical solutions are provided according to the present disclosure.

A method for manufacturing a reverse conducting IGBT device is provided, which includes:

forming, based on a semiconductor structure including an IGBT cell region and a fast recovery diode cell region which are separated from each other, a copper electrode layer on an upper surface of the IGBT cell region;

performing ion implantation on the semiconductor structure by using the copper electrode layer as a barrier layer, for controlling minority carrier lifetime of the fast recovery diode cell region; and forming a metal electrode layer on an upper surface of the fast recovery diode cell region, where the metal electrode layer is electrically connected to the copper electrode layer on the upper surface of the IGBT cell region.

Preferably, a thickness of the copper electrode layer may range from 2 μm to 30 μm.

Preferably, an ion implanted during the ion implantation may be a Pt ion, an He ion or an H ion.

Preferably, the forming the copper electrode layer on the upper surface of the IGBT cell region may include:

forming a patterned mask layer on the upper surface of the IGBT cell region;

forming a copper metal layer on the upper surface of the IGBT cell region; and removing the mask layer to form the copper electrode layer on the upper surface of the IGBT cell region.

Preferably, the mask layer may be a photoresist mask layer.

Preferably, a height of the mask layer may be greater than a height of the copper electrode layer.

Preferably, after the forming the copper electrode layer and before the performing the ion implantation, the method may further include: forming an implantation barrier layer on a region of the semiconductor structure other than the IGBT cell region and the fast recovery diode cell region.

Preferably, the implantation barrier layer may be a photoresist layer.

Preferably, after the performing the ion implantation, the method may further include: removing the implantation barrier layer.

Preferably, the metal electrode layer may be an aluminum electrode layer.

A reverse conducting IGBT device which is formed by the above method is provided.

As compared with the conventional technology, the technical solutions provided according to the present disclosure have at least the following advantages.

In the method for manufacturing a reverse conducting IGBT device according to the present disclosure, the ion implantation is performed for controlling minority carrier lifetime of the FRD cell region, thereby improving the performance of the device. In addition, the copper electrode layer is formed on the IGBT cell region, where the copper electrode layer serves as a metal electrode of the IGBT cell region, as well as the barrier layer during the ion implantation for protecting the semiconductor structure of the IGBT cell region from being affected by the ion implantation, thereby controlling the minority carrier lifetime of the FRD cell region without affecting minority carrier lifetime of the IGBT cell region, thus the performance of the device is further improved. In addition, the copper metal layer is used as a metal electrode of the IGBT, thereby further improving the stability of the device.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION

The technical solution according to the embodiments of the present disclosure will be described clearly and completely as follows in conjunction with the drawings. It is apparent that the described embodiments are only a few rather than all of the embodiments according to the present disclosure. Any other embodiments obtained by those skilled in the art based on the embodiments in the present disclosure without any creative work fall in the scope of the present disclosure.

As described in the BACKGROUND, the performance of the existing reverse conducting IGBT device needs to be further improved.

The inventors found that, in a reverse conducting IGBT device with the existing structure, an IGBT portion and an FRD portion are included in one semiconductor structure, and the IGBT portion and the FRD portion are located at different positions, in which case minority carrier lifetime of the FRD portion directly affects recombination characteristics of carriers of the FRD portion. The minority carrier lifetime of the FRD portion needs to be controlled to improve the performance of the FRD portion. However, the minority carrier lifetime of carriers of the IGBT portion is affected in a case where the minority carrier lifetime of the carriers is controlled by means of radiation or ion implantation, resulting in a great conduction voltage drop of the IGBT, thus the performance of the IGBT is affected.

Based on analysis, the inventors consider that, the minority carrier lifetime of the FRD portion of the reverse conducting IGBT device may be controlled by means of ion implantation. A barrier layer is provided on the IGBT region to protect the minority carrier lifetime of the IGBT region from being affected. However, this manner involves high process complexity and increased process cost.

Based on analysis and research on the manufacturing process of the existing reverse conducting IGBT device, the inventors found that an upper surface of the existing IGBT region is provided with a metal electrode layer. If a copper layer with a great thickness is used as the metal electrode layer, the metal electrode layer may serve as a barrier layer for preventing ions from entering the IGBT region during the ion implantation process, thereby controlling the minority carrier lifetime of the FRD portion of the reverse conducting IGBT device on the basis of the conventional processing steps without affecting the minority carrier lifetime of the IGBT region.

Figure 1:
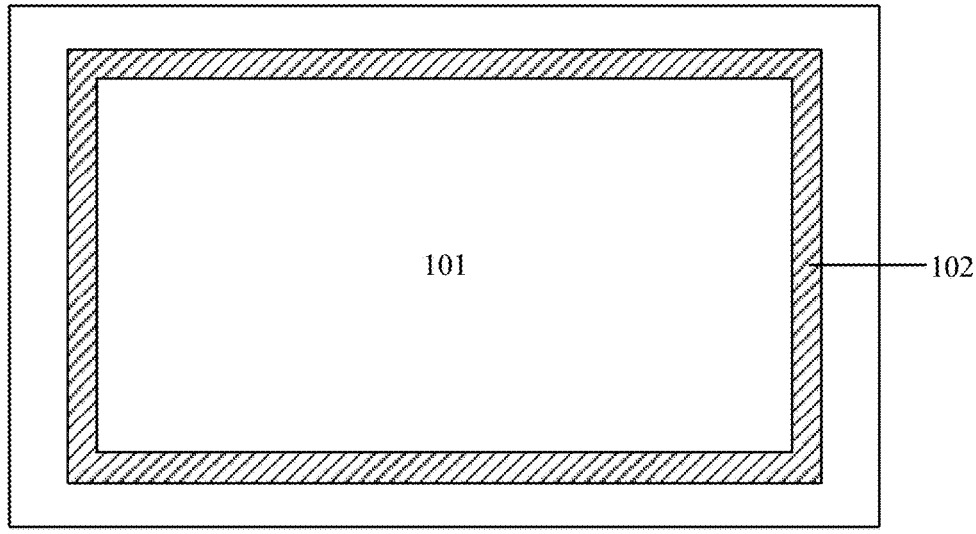
FIG. 1 is a top view illustrating a structure of a reverse conducting IGBT according to the conventional technology.
Figure 2:
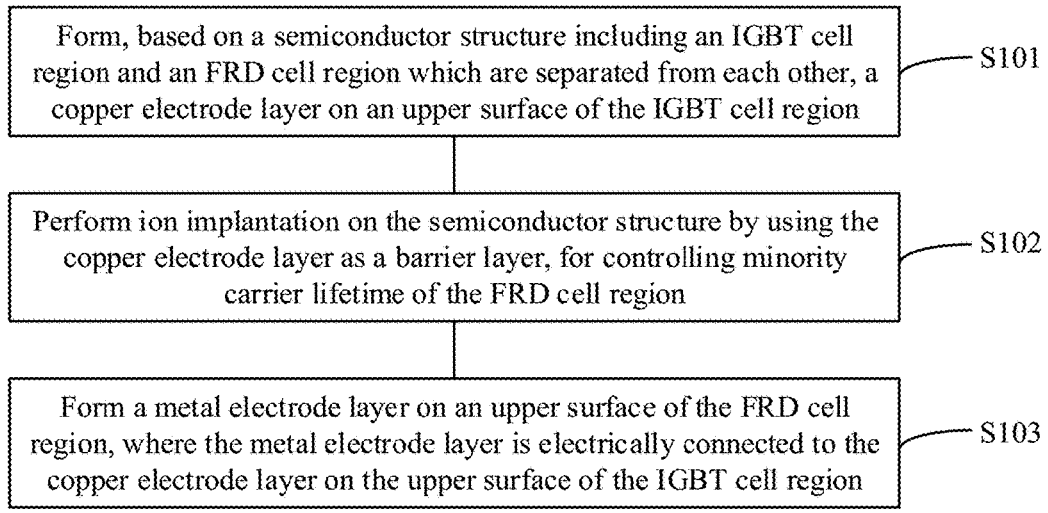
FIG. 2 is a flowchart of a method for manufacturing a reverse conducting IGBT device according to the present disclosure.

Based on this, a method for manufacturing a reverse conducting IGBT device is provided according to the present disclosure. As shown in FIG. 2, the method includes the following steps S101 to S103.

In step S101, based on a semiconductor structure including an IGBT cell region and a fast recovery diode cell region which are separated from each other, a copper electrode layer is formed on an upper surface of the IGBT cell region.

In step S102, ion implantation is performed on the semiconductor structure by using the copper electrode layer as a barrier layer, for controlling minority carrier lifetime of the FRD cell region.

In step S103, a metal electrode layer is formed on an upper surface of the FRD cell region, where the metal electrode layer is electrically connected to the copper electrode layer on the upper surface of the IGBT cell region.

Specifically, the IGBT cell region includes functional regions of the IGBT, which include IGBT functional regions well known in the art, such as a source region, a collector region, a gate region, a body region, and a drift region. The FRD cell region includes FRD functional regions well known in the art. The IGBT cell region and the FRD cell region do not include the metal electrode located on the upper surface of the semiconductor structure.

In step S101, the copper electrode layer includes an emitter electrode layer and a gate electrode layer formed on the upper surface of the semiconductor structure. A method for forming the copper electrode layer may include a conventional Damascus process or a preparation process disclosed in Chinese patent publication No. CN103165524A.

In step S102, the copper electrode layer serves as the barrier layer of the IGBT cell region, for protecting the IGBT cell region from being affected by the ion implantation.

In step S103, the metal electrode layer on the upper surface of the FRD cell region may be formed by aluminum, copper, silver or other metals, and may serve as an electrode layer on the FRD cell region. The electrode layer may be electrically connected to the copper electrode layer on the upper surface of the IGBT cell region in a direct contact or lead contact manner.

In the method for manufacturing a reverse conducting IGBT device according to the present disclosure, the ion implantation is performed for controlling minority carrier lifetime of the FRD cell region, thereby improving the performance of the device. In addition, the copper electrode layer is formed on the IGBT cell region, where the copper electrode layer serves as a metal electrode of the IGBT cell region, as well as the barrier layer during the ion implantation for protecting the semiconductor structure of the IGBT cell region from being affected by the ion implantation, thereby controlling the minority carrier lifetime of the FRD cell region without affecting minority carrier lifetime of the IGBT cell region, thus the performance of the device is further improved. In addition, the copper metal layer is used as a metal electrode of the IGBT, thereby further improving the stability of the device.

The above content is a central idea of the present disclosure. The technical solution according to the embodiments of the present disclosure will be described clearly and completely as follows in conjunction with the drawings. It is apparent that the described embodiments are only a few rather than all of the embodiments according to the present disclosure. Any other embodiments obtained by those skilled in the art based on the embodiments in the present disclosure without any creative work fall in the scope of the present disclosure.

First Embodiment

Figure 3:
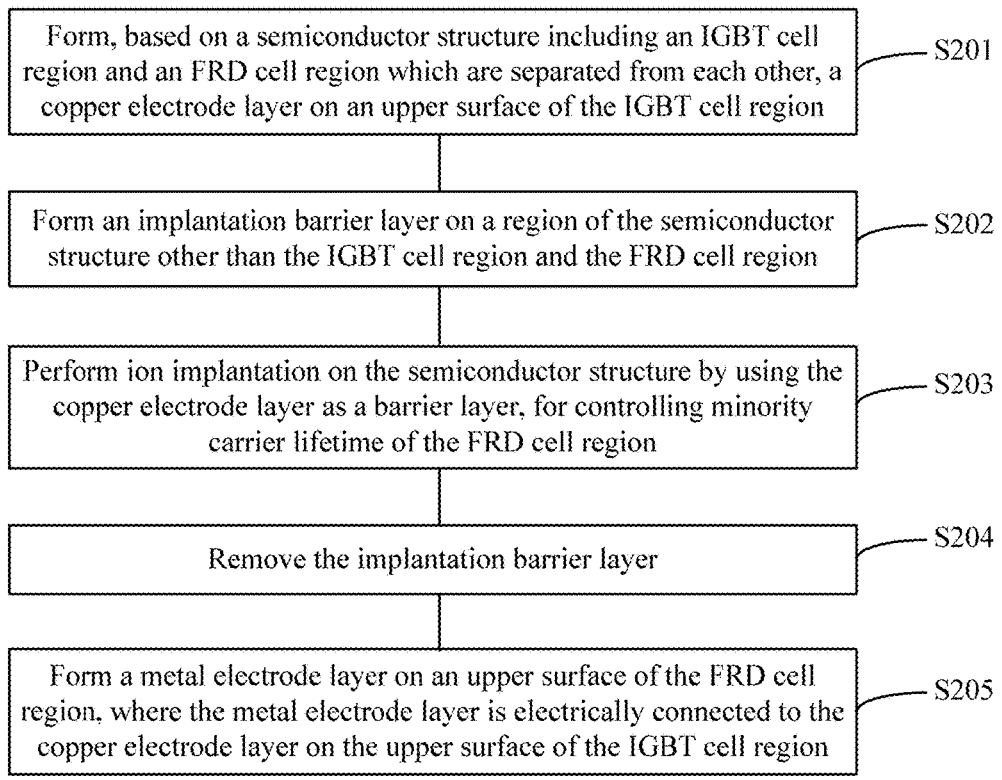
FIG. 3 is a flowchart of a method for manufacturing a reverse conducting IGBT device according to a first embodiment of the present disclosure.

A method for manufacturing a reverse conducting IGBT device is provided according to this embodiment. Reference is made to FIG. 3, which is a flowchart of a doping method for a semiconductor structure according to this embodiment. The method includes the following steps S201 to S205.

In step S201, based on a semiconductor structure including an IGBT cell region and a fast recovery diode cell region which are separated from each other, a copper electrode layer is formed on an upper surface of the IGBT cell region.

In step S202, an implantation barrier layer is formed on a region of the semiconductor structure other than the IGBT cell region and the FRD cell region.

In step S203, ion implantation is performed on the semiconductor structure by using the copper electrode layer as a barrier layer, for controlling minority carrier lifetime of the FRD cell region.

In step S204, the implantation barrier layer is removed.

In step S205, a metal electrode layer is formed on an upper surface of the FRD cell region, where the metal electrode layer is electrically connected to the copper electrode layer on the upper surface of the IGBT cell region.

Specifically, in step S201, the semiconductor structure includes the IGBT cell region and the FRD cell region which are separated from each other, and the IGBT cell region is surrounded by the FRD cell region. Specifically, the semiconductor structure includes functional regions of the formed IGBT device and a gate region of the IGBT on a semiconductor substrate and an epitaxial layer, and functional regions of the FRD device on the semiconductor substrate and the epitaxial layer.

Figure 4:
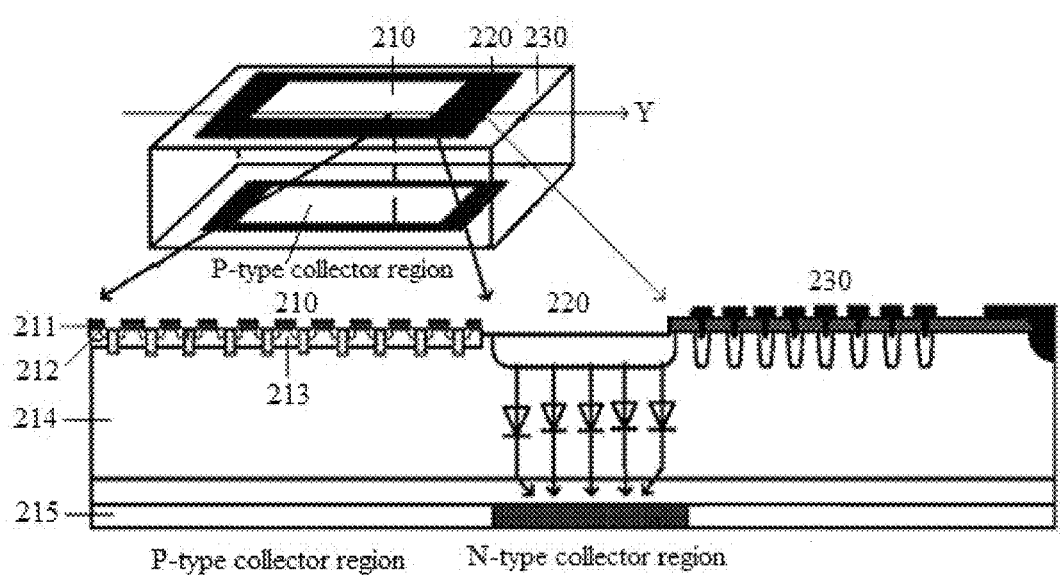
FIG. 4 is a perspective view and a partially enlarged sectional view of a semiconductor structure according to the first embodiment of the present disclosure.

Specifically, a perspective view and a sectional view of a portion of the regions of the semiconductor structure are shown in FIG. 4. The semiconductor structure includes an IGBT cell region 210 and an FRD cell region 220 surrounding the IGBT cell region. As can be seen from a sectional view taken along the Y-axis in FIG. 4, the IGBT cell region 210 includes a gate region 211, a source region 212, a body region 213, a drift region 214 and a collector region 215.

In this embodiment, the collector region of the IGBT cell region is P-type, and the collector region of the FRD cell region is N-type.

Further, in this embodiment, the semiconductor structure further includes a termination region 230 surrounding the FRD cell region.

In this embodiment, a thickness of the copper electrode layer ranges from 2 μm to 30 μm. Preferably, the thickness of the copper electrode layer may range from 5 μm to 30 μm. Specifically, the thickness of the copper electrode layer is 15 μm.

In this embodiment, the forming the copper electrode layer on the upper surface of the IGBT cell region in step S201 may include the following steps S2011 to S2013.

In step S2011, a patterned mask layer is formed on the upper surface of the IGBT cell region.

In step S2012, a copper metal layer is formed on the upper surface of the IGBT cell region.

In step S2013, the mask layer is removed to form the copper electrode layer on the upper surface of the IGBT cell region.

Specifically, in step S2011, a patterned photoresist mask layer is formed on the upper surface of the IGBT cell region. Specifically, the patterned photoresist mask layer is formed on the upper surface of the IGBT cell region by coating, photolithography and developing using a photolithographic process.

Further, in this step, a height of the photoresist mask layer is greater than a height of the copper electrode layer.

In step S2012, the copper metal layer may be formed on the upper surface of the IGBT cell region by an electroplating process. In this embodiment, the thickness of the copper electrode layer ranges from 5 μm to 30 μm, and a copper metal layer having a thickness ranging from 5 μm to 30 μm is formed on the upper surface of the IGBT cell region. Specifically, the thickness of the copper electrode layer is 15 μm, and a copper metal layer having a thickness of 15 μm may be formed on the upper surface of the IGBT cell region.

In other embodiments of the present disclosure, the copper metal layer may be formed by a sputtering process, an evaporation process or the like.

In step S2013, the mask layer is removed by a stripping process to form the copper electrode layer on the upper surface of the IGBT cell region. Specifically, the mask layer is a photoresist mask layer, and the copper metal layer is not formed in an area having the photoresist mask layer. The mask layer is removed by the stripping process to form the copper electrode layer.

In addition, the height of the photoresist mask layer is greater than the height of the copper metal layer such that the stripping process is easier to perform.

In other embodiments of the present disclosure, in step S201, the copper electrode layer may also be formed by a Damascus process, specific steps of which is not described in detail herein.

Next, step S202 is performed, in which the implantation barrier layer is formed on a region of the semiconductor structure other than the IGBT cell region and the FRD cell region.

Specifically, in this embodiment, a photoresist layer is formed on the region of the semiconductor structure other than the IGBT cell region and the FRD cell region, and the thickness of the photoresist layer is greater than 30 μm. In other embodiments, preferably, the thickness of the photoresist layer may be greater than 50 μm.

The implantation barrier layer is formed on the region of the semiconductor structure other than the IGBT cell region and the FRD cell region, such that the region of the device other than the IGBT cell region device and the FRD cell region is not affected by the ion implantation, thereby further improving the performance of the device.

Next, step S203 is performed, in which ion implantation is performed on the semiconductor structure by using the copper electrode layer as the barrier layer, for controlling the minority carrier lifetime of the FRD cell region.

Specifically, in this step, the ion implantation is performed for controlling the minority carrier lifetime of the FRD cell region, and an ion implanted during the ion implantation is a Pt ion, an He ion or an H ion.

The minority carrier lifetime of the IGBT region is not affected by the ion implantation since the copper electrode layer serves as the barrier layer. Therefore, the performance of the FRD cell region is improved, such that the overall performance of the device is improved.

Next, step S204 is performed, in which the implantation barrier layer is removed.

Specifically, in this embodiment, the implantation barrier layer is a photoresist layer, and the implantation barrier layer may be totally removed by a stripping process.

Next, step S205 is performed, in which the metal electrode layer is formed on the upper surface of the FRD cell region. The metal electrode layer is electrically connected to the copper electrode layer on the upper surface of the IGBT cell region.

Specifically, in this step, the metal electrode layer is formed on the upper surface of the FRD cell region to form a complete FRD. The metal electrode layer may be an aluminum electrode layer, and the aluminum electrode layer may be formed by a sputtering process, an evaporation process or the like. In addition, the aluminum electrode layer is electrically connected to the copper electrode layer on the upper surface of the IGBT cell region to form a complete device.

In other embodiments of the present disclosure, the metal electrode layer may further be a copper electrode layer, a silver electrode layer, a platinum electrode layer, and the like. In the method for manufacturing a reverse conducting IGBT device according to this embodiment, the ion implantation is performed for controlling minority carrier lifetime of the FRD cell region, thereby improving the performance of the device. In addition, the copper electrode layer is formed on the IGBT cell region, where the copper electrode layer serves as a metal electrode of the IGBT cell region, as well as the barrier layer during the ion implantation for protecting the semiconductor structure of the IGBT cell region from being affected by the ion implantation, thereby controlling the minority carrier lifetime of the FRD cell region without affecting minority carrier lifetime of the IGBT cell region, thus the performance of the device is further improved. In addition, the copper metal layer is used as a metal electrode of the IGBT, such that a metal wire is bonded to the copper layer on the surface of the IGBT region instead of the aluminum layer on the FRD region during a packaging process, thereby further improving the stability of the device.

Second Embodiment

Figure 5:
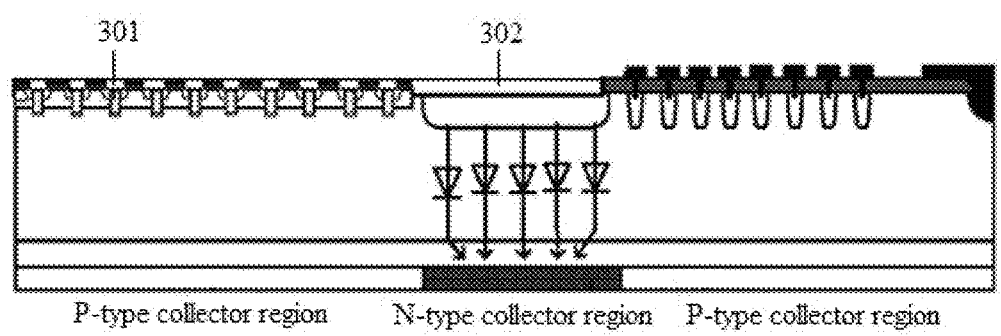
FIG. 5 is a sectional view of a reverse conducting IGBT device according to a second embodiment of the present disclosure.

A reverse conducting IGBT device manufactured using the method according to the above embodiment is provided in this embodiment. The device includes a semiconductor structure including an IGBT cell region and an FRD cell region surrounding the IGBT cell region. As shown in FIG. 5, an upper surface of the IGBT cell region is provided with a copper electrode layer 301, where a thickness of the copper metal layer ranges from 5 µm to 30 µm. In addition, an upper surface of the FRD cell region is provided with a metal electrode layer 302, where the metal electrode layer is electrically connected to the copper electrode layer on the upper surface of the IGBT cell region.

In the reverse conducting IGBT device according to this embodiment, the ion implantation is performed for controlling minority carrier lifetime of the FRD cell region, thereby improving the performance of the device. In addition, the copper electrode layer is formed on the IGBT cell region, where the copper electrode layer serves as a metal electrode of the IGBT cell region, as well as the barrier layer during the ion implantation for protecting the semiconductor structure of the IGBT cell region from being affected by the ion implantation, thereby controlling the minority carrier lifetime of the FRD cell region without affecting minority carrier lifetime of the IGBT cell region, thus the performance of the device is further improved. In addition, the copper metal layer is used as a metal electrode of the IGBT, thereby further improving the stability of the device.

It should be noted that embodiments in this specification are described in a progressive manner, each of the embodiments emphasizes differences between the embodiment and other embodiments, and the same or similar parts among the embodiments can be referred to each other. Since device embodiments are similar to method embodiments, the description thereof is relatively simple, and reference may be made to the description of the method embodiments for relevant parts.

Finally, it should further be noted that relationship terms such as "first", "second" and the like are only intended to distinguish an entity or operation from another, rather than to indicate that such an actual relationship or order exists among the entities or operations. Furthermore, terms such as "include", "comprise" or any other variants are intended to be non-exclusive. Therefore, a process, method, article or device including a plurality of elements includes not only the elements but also other elements that are not enumerated, or further includes the elements inherent for the process, method, article or device. Unless expressively limited otherwise, the statement "comprising (including) a . . . " does not exclude a case where other similar elements may exist in the process, method, article or device.

Although specific embodiments are described for explaining the principle and implementation of the present disclosure, the description of the embodiments is only for facilitating understanding the idea and core of the present disclosure. For those skilled in the art, modification may be made to the specific embodiment and application according to the spirit of the present disclosure. In summary, the description is not to be interpreted as limitation to the present disclosure.

The invention claimed is:

1. A method for manufacturing a reverse conducting IGBT device, comprising:
   forming, based on a semiconductor structure comprising an IGBT cell region and a fast recovery diode cell region which are separated from each other, a copper electrode layer on an upper surface of the IGBT cell region;
   performing ion implantation on the semiconductor structure by using the copper electrode layer as a barrier layer, for controlling minority carrier lifetime of the fast recovery diode cell region; and
   forming a metal electrode layer on an upper surface of the fast recovery diode cell region, wherein the metal electrode layer is electrically connected to the copper electrode layer on the upper surface of the IGBT cell region.

2. The method according to claim 1, wherein a thickness of the copper electrode layer ranges from 2 µm to 30 µm.

3. The method according to claim 1, wherein an ion implanted during the ion implantation is a Pt ion, an He ion or an H ion.

4. The method according to claim 1, wherein the forming the copper electrode layer on the upper surface of the IGBT cell region comprises:
   forming a patterned mask layer on the upper surface of the IGBT cell region;
   forming a copper metal layer on the upper surface of the IGBT cell region; and
   removing the mask layer to form the copper electrode layer on the upper surface of the IGBT cell region.

5. The method according to claim 4, wherein the mask layer is a photoresist mask layer.

6. The method according to claim 5, wherein a height of the mask layer is greater than a height of the copper electrode layer.

7. The method according to claim 1, wherein after the forming the copper electrode layer and before the performing the ion implantation, the method further comprises:
   forming an implantation barrier layer on a region of the semiconductor structure other than the IGBT cell region and the fast recovery diode cell region.

8. The method according to claim 7, wherein the implantation barrier layer is a photoresist layer.

9. The method according to claim 7, wherein after the performing the ion implantation, the method further comprises:
   removing the implantation barrier layer.

10. The method according to claim 1, wherein the metal electrode layer is an aluminum electrode layer.

11. A reverse conducting IGBT device, comprising:
a semiconductor structure comprising an IGBT cell region and a fast recovery diode cell region which are separated from each other, a copper electrode layer on an upper surface of the IGBT cell region, and a metal electrode layer on an upper surface of the fast recovery diode cell region, wherein the metal electrode layer is electrically connected to the copper electrode layer on the upper surface of the IGBT cell region,
wherein the semiconductor structure is implanted with an ion by using the copper electrode layer as a barrier layer, for controlling minority carrier lifetime of the fast recovery diode cell region.

12. The reverse conducting IGBT device according to claim 11, wherein a thickness of the copper electrode layer ranges from 2 μm to 30 μm.

13. The reverse conducting IGBT device according to claim 11, wherein the ion implanted is a Pt ion, an He ion or an H ion.

14. The reverse conducting IGBT device according to claim 11, further comprising an implantation barrier layer on a region of the semiconductor structure other than the IGBT cell region and the fast recovery diode cell region.

15. The reverse conducting IGBT device according to claim 14, wherein the implantation barrier layer is a photoresist layer.

16. The reverse conducting IGBT device according to claim 11, wherein the metal electrode layer is an aluminum electrode layer.

* * * * *